United States Patent
Bechtel et al.

(10) Patent No.: US 10,205,066 B2
(45) Date of Patent: Feb. 12, 2019

(54) WHITE PHOSPHOR CONVERTED LED WITH STABLE FLUX OUTPUT VERSUS TEMPERATURE

(71) Applicant: KONINKLIJKE PHILIPS N.V., Eindhoven (NL)

(72) Inventors: Hans-Helmut Bechtel, Aachen (DE); Oliver Jens Steigelmann, Aachen (DE); Detlef Uwe Wiechert, Aachen (DE); Matthias Heidemann, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/551,220

(22) PCT Filed: Feb. 15, 2016

(86) PCT No.: PCT/EP2016/053117
§ 371 (c)(1),
(2) Date: Aug. 15, 2017

(87) PCT Pub. No.: WO2016/134995
PCT Pub. Date: Sep. 1, 2016

(65) Prior Publication Data
US 2018/0026165 A1   Jan. 25, 2018

(30) Foreign Application Priority Data
Feb. 23, 2015   (EP) .................................... 15156087

(51) Int. Cl.
*H01J 1/63*   (2006.01)
*H01L 33/50*   (2010.01)
*F21V 8/00*   (2006.01)

(52) U.S. Cl.
CPC .......... *H01L 33/502* (2013.01); *G02B 6/0003* (2013.01)

(58) Field of Classification Search
None
See application file for complete search history.

(56) References Cited

U.S. PATENT DOCUMENTS

| 2004/0145308 A1* | 7/2004 | Rossner .................. C04B 35/44 313/512 |
| 2009/0033201 A1* | 2/2009 | Shimooka .......... C09K 11/0883 313/483 |

(Continued)

FOREIGN PATENT DOCUMENTS

EP   2482341 A1   8/2012

OTHER PUBLICATIONS

EPO as ISA, "International Search Report and Written Opinion" dated May 12, 2016 from International Application No. PCT/EP2016/053117, filed Feb. 15, 2016, 12 pages.

(Continued)

*Primary Examiner* — Ali Naraghi
(74) *Attorney, Agent, or Firm* — Brian D. Ogonowsky; Patent Law Group LLP

(57) ABSTRACT

The invention provides a lighting device comprising a solid state light source and a ceramic body, wherein the solid state light source is configured to provide blue light source light to the ceramic body, wherein the ceramic body comprises a ceramic material configured to wavelength convert part of the blue light source light into yellow converter light, to provide white lighting device light comprising said blue light source light and said yellow converter light, said white lighting device light having a color point selected from the range of $0.18 \leq u' \leq 0.25$ and $0.42 \leq v' \leq 0.54$, and wherein the ceramic material comprises a $(Y_{(1-y-q-z)}, Gd_y, Lu_q, Ce_z)_3(Al_{(1-x)}, Ga_x)_5 O_{12}$ ceramic material, with $0 \leq x \leq 0.6$, $0 \leq y \leq 0.5$, $0 \leq q < 1$ and $0.001 \leq z \leq 0.06$.

11 Claims, 7 Drawing Sheets

(56) References Cited

U.S. PATENT DOCUMENTS

| | | | |
|---|---|---|---|
| 2012/0329184 A1* | 12/2012 | Petry | H01L 33/56 438/27 |
| 2013/0099657 A1* | 4/2013 | Chuang | C09K 11/7774 313/498 |
| 2015/0144978 A1* | 5/2015 | Miyagawa | C04B 35/44 257/98 |

OTHER PUBLICATIONS

Bechtel et al., "Lumiramic: A New Phosphor Technology for High Performance Solid State Light Sources", Proceedings of SPIE, vol. 7058, Aug. 26, 2008, p. 70580E.
Extended European Search Report dated Aug. 31, 2015, European Application No. 15156087.7, 8 pages.

* cited by examiner

WHITE PHOSPHOR CONVERTED LED WITH STABLE FLUX OUTPUT VERSUS TEMPERATURE

CROSS-REFERENCE TO RELATED APPLICATIONS

The present application is a § 371 application of International Application No. PCT/EP 2016/053117 filed on Feb. 15, 2016 and titled "WHITE PHOSPHOR CONVERTED LED WITH STABLE FLUX OUTPUT VERSUS TEMPERATURE," which claims the benefit of European Patent Application No. 15156087.7 filed on Feb. 23, 2015. International Application No. PCT/EP 2016/053117 and European Patent Application No. 15156087.7 are incorporated herein.

FIELD OF THE INVENTION

The invention relates to a lighting device, such as for use in automotive applications. The invention further relates to a process for the production of a cerium comprising garnet for use in such lighting device, as well as to the cerium comprising garnet obtainable with such process.

BACKGROUND OF THE INVENTION

Luminescent ceramic materials are known in the art. US2004145308, for instance, describes a light source, having at least one LED for emitting a primary radiation and at least one luminescence conversion body having at least one luminescent material for converting the primary radiation into a secondary radiation. The luminescence conversion body is a polycrystalline ceramic body. The LED is based on GaInN and emits blue primary radiation. The ceramic body comprises for example a luminescent material based on a cerium-doped yttrium aluminum garnet. This luminescent material emits yellow secondary radiation. Blue primary radiation and yellow secondary radiation penetrate through the luminescence conversion body and are perceived as white light by the observer. In order to produce the luminescence conversion body, provision is made of a polycrystalline ceramic body which is united with a solution of a dopant. By means of a thermal treatment, the dopant (activator) diffuses into the ceramic body, the luminescent material being formed.

SUMMARY OF THE INVENTION

For some lighting applications, such as at least automotive lighting applications, quality and reliability of lighting devices is essential. Also in automotive LEDs become more and more common, even in headlights. It appeared however that some light sources are not suitable for application in e.g. automotive, as the temperature characteristics were deficient.

Hence, it is an aspect of the invention to provide an alternative lighting device, which preferably further at least partly obviates one or more of above-described drawbacks. Yet, it is an aspect of the invention to provide an alternative process for the production of a wavelength converter for such lighting device, which preferably further at least partly obviates one or more of above-described drawbacks.

In a first aspect, the invention provides a lighting device ("device") comprising a solid state light source and a ceramic body, wherein the solid state light source is configured to provide blue light source light to the ceramic body), wherein the ceramic body comprises a ceramic material configured to wavelength convert (i.e. to convert) part of the blue light source light into yellow converter light, to provide white lighting device light comprising said blue light source light and said yellow converter light, said white lighting device light especially having a color point selected from the range of $0.18 \leq u' \leq 0.25$ and $0.42 \leq v' \leq 0.54$ (with the CIE1976 color coordinates u' and v' (CIELUV)), even more especially $0.2 \leq u' \leq 0.21$ and $0.45 \leq v' \leq 0.51$, and wherein the ceramic material especially comprises a $A_3B_5O_{12}:Ce^{3+}$ type ceramic material ("ceramic garnet"), wherein A may comprise one or more of yttrium (Y), gadolinium (Gd) and lutetium (Lu), and wherein B may comprise aluminum (Al) and/or gallium (Ga), especially wherein the ceramic material comprises $(Y_{(1-y-q-z)},Gd_y,Lu_q,Ce_z)_3(Al_{(1-x)},Ga_x)_5O_{12}$ ceramic material, with $0 \leq x \leq 0.6$, $0 \leq y \leq 0.5$ (especially $0 \leq y \leq 0.4$), $0 \leq q < 1$, (especially $0 \leq q \leq 0.8$), and $0.001 \leq z \leq 0.06$, even more especially in an embodiment $x > 0$, such as $0 < x \leq 0.5$, and within yet a further embodiment $0.05 \leq y \leq 0.2$, and $0.0015 \leq z \leq 0.03$. Further, in an embodiment, $q=0$. In yet another embodiment, q is in the range of 0.4-0.6

It surprisingly appeared that although at higher temperatures the solid state light source decreases in intensity, the total light flux substantially remains the same up to a temperature of about 100° C. This is excellent for high demanding applications, such as automotive or projector applications. Especially, for automotive it may be desired that the light flux is identical at low temperatures applications (such as shortly after switching on the lighting device) and at high temperature applications (such as after some operation time, like at least 15 minutes). Further, it may also be important that the light flux is substantially independent of the ambient temperature. Hence, hereby the invention thus also provides the use of such lighting device, for providing white lighting device light having, at constant light source power, a temperature independent light flux of the white lighting device light, wherein up to a temperature of at least 100° C. of the light source the light flux is in the range of 90-110% of the light flux at 20° C. Especially, the lighting device may be used in a headlight of a motorized vehicle having a stable flux at different temperatures selected from the range of 10-100° C.

Luminescent ceramic garnets doped with $Ce^{3+}$ (trivalent cerium) can be used to convert blue light into light with a longer wavelength, e.g. within the green to red wavelength region, such as in the range of about 500-750 nm, sometimes even in the blue region. As further indicated below, A may also refer to other rare earth elements and B may include Al only, but may optionally also include gallium. The formula $A_3B_5O_{12}:Ce^{3+}$ especially indicates the chemical formula, i.e. the stoichiometry of the different type of elements A, B and O (3:5:12). However, as known in the art the compounds indicated by such formula may optionally also include a small deviation from stoichiometry. The ceramic material comprises a garnet material. Hence, the body especially comprises a luminescent ceramic.

The garnet material, especially the ceramic garnet material, is herein also indicated as "luminescent material". The luminescent material comprises an $A_3B_5O_{12}:Ce^{3+}$ (garnet material), wherein A is especially selected from the group consisting of Sc, Y, Tb, Gd, and Lu, wherein B is especially selected from the group consisting of Al and Ga. More especially, A comprises one or more of yttrium (Y), gadolinium (Gd) and lutetium (Lu), and B comprises aluminum (Al). Such garnet may be doped with cerium (Ce), and optionally with other luminescent species such as praseodymium (Pr).

In a specific embodiment, B consists of about 40% or more of Al and 60% or less of Ga. Especially, B comprises aluminum (Al), however, B may also partly comprise gallium (Ga) and/or scandium (Sc) and/or indium (In), especially up to about 20% of Al, more especially up to about 10% of Al may be replaced (i.e. the B ions essentially consist of 90 or more mole % of Al and 10 or less mole % of one or more of Ga, Sc and In); B may especially comprise up to about 10% gallium. In another variant, B and O may at least partly be replaced by Si and N.

As indicated above, the element A may especially be selected from the group consisting of yttrium (Y), gadolinium (Gd), terbium (Tb) and lutetium (Lu), even more especially substantially only from the group consisting of Y and Gd, yet even more especially from both Y and Gd, but with a molar ratio of Y and Gd larger than 1. Hence, in an embodiment, $A_3B_5O_{12}:Ce^{3+}$ comprises $(Y,Gd)_3Al_5O_{12}:Ce^{3+}$, especially with both Y and Gd.

As indicated below, especially the ceramic material is obtainable by a sintering process and/or a hot pressing process, followed by an annealing in a reducing atmosphere. Therefore, in a specific embodiment the ceramic body is obtainable by a method comprising a sintering process and an isostatic pressing process (see also below) at elevated temperatures of starting material (which may have been pre-sintered at elevated temperatures), to provide the ceramic body, followed by a method comprising an annealing process in a reducing atmosphere at a temperature of at least 1000° C. Yet even more especially, the ceramic body is obtainable by a method comprising a sintering process and an isostatic pressing process at elevated temperatures of starting material in a neutral or oxidizing atmosphere, to provide the ceramic body, followed by said method comprising said annealing process (in a reducing atmosphere at a temperature of at least 1000° C.). Hence, especially the herein described method for the production of a ceramic body includes a method comprising processing starting material at elevated temperatures, which is especially performed in a neutral or oxidizing atmosphere. The starting material may include a mixture of starting powders (which may especially have been pre-sintered at elevated temperatures). However, the starting material may also include a powder compact or green body (shaped starting powder, for instance obtainable by dry pressing). The oxidizing atmosphere may especially include one or more of $N_2$, $CO_2$, Ar, He, Kr, etc., as well as (some) $O_2$. In an embodiment, the ceramic body is an elongated ceramic body, see also below.

Ceramic bodies that have been treated in this way are substantially better (more efficient in light concentration (at high light source powers)) than untreated ceramic bodies. The optical properties and/or efficiency come close to those of single crystals (see also above). However, as indicated above ceramic bodies may be produced quicker and more easily and for this reason at significantly lower costs than single crystals.

The term "ceramic" especially relates to an inorganic material that is—amongst others—obtainable by heating a (poly crystalline) powder at a temperature of at least 500° C., especially at least 800° C., such as at least 1000° C., like at least 1400° C., under reduced pressure, atmospheric pressure or high pressure, such as in the range of $10^{-8}$ to 500 MPa, such as especially at least 0.5 MPa, like especially at least 1 MPa, like 1 to about 500 MPa, such as at least 5 MPa, or at least 10 MPa, especially under uniaxial or isostatic pressure, especially under isostatic pressure. A specific method to obtain a ceramic is hot isostatic pressing (HIP), whereas the HIP process may be a post-sinter HIP, capsule HIP or combined sinter-HIP process, like under the temperature and pressure conditions as indicate above. The ceramic obtainable by such method may be used as such, or may be further processed (like polishing). A ceramic especially has density that is at least 90% (or higher, see below), such as at least 95%, like in the range of 97-100%, of the theoretical density (i.e. the density of a single crystal). A ceramic may still be polycrystalline, but with a reduced, or strongly reduced volume between grains (pressed particles or pressed agglomerate particles). The heating under elevated pressure, such as HIP, may e.g. be performed in an inert gas, such as comprising one or more of $N_2$ and argon (Ar). Especially, the heating under elevated pressures is preceded by a sintering process at a temperature selected from the range of 1400-1900° C., such as 1500-1800° C. Such sintering may be performed under reduced pressure, such as at a pressure of $10^{-2}$ Pa or lower. Such sintering may already lead to a density of in the order of at least 95%, even more especially at least 99%, of the theoretical density. After both the pre-sintering and the heating, especially under elevated pressure, such as HIP, the density of the ceramic body can be close to the density of a single crystal. However, a difference is that grain boundaries are available in the ceramic body, as the ceramic body is polycrystalline. Such grain boundaries can e.g. be detected by optical microscopy or SEM. Hence, herein the ceramic body especially refers to a sintered polycrystalline having a density substantially identical to a single crystal (of the same material). Such body may thus be highly transparent for visible light (except for the absorption by the light absorbing species such as especially $Ce^{3+}$).

The above described process especially provides a sintered garnet body, which is especially subjected to the high pressure process at elevated temperatures, such as HIP (see above). Hence, especially the method comprising processing starting material at elevated temperatures comprises a method comprising a sintering process and an isostatic pressing process, even more especially a presintering at elevated pressure followed by said high pressure process at elevated temperatures.

After obtaining the ceramic body, the body may be polished. Before or after polishing the annealing process (in an oxidative atmosphere) may be executed, especially before polishing. In a further specific embodiment, said annealing process lasts for at least 2 hours, such as at least 2 hours at least 1200° C. Further, especially the reducing atmosphere comprises for example $H_2$.

The ceramic body may have light guiding or wave guiding properties. Hence, the ceramic body is herein also indicated as wave guide or light guide. As the ceramic body may be used as light concentrator, the ceramic body is herein also indicated as light concentrator. The ceramic body will in general have (some) transmission of visible light in a direction perpendicular to the length of the ceramic body. Without the activator such as trivalent cerium, the transmission in the visible might be close to 100%.

Hence, in a specific embodiment the ceramic body is obtainable by a process comprising a sintering stage comprising sintering a mixture of starting materials (in the form of a "green body"), optionally including $SiO_2$, at a temperature in the range of 1500-2000° C. in a first atmosphere to provide a sintered body followed by an annealing stage comprising an annealing at a temperature in the range of 1000-1600° C. in a second atmosphere to provide said ceramic body, wherein the first atmosphere differs from the second atmosphere, and wherein the second atmosphere comprises a reducing atmosphere in case the first atmosphere had been more oxidizing. In general, sintering and annealing are done in atmospheres with different oxidizing/reducing strength.

Especially these temperatures, and this sequence of stages may provide suitable ceramic bodies. Without the desire to be bound by theory, it seems that the alternation of oxidizing sintering and reducing annealing introduces crystal lattice defects, which may be responsible for the surprising optical behavior. Changing thermo luminescence properties before and after the annealing process indicate clearly changing lattice defect structures in the ceramic bodies.

Hence, in a further embodiment the invention also provides such process, amongst other to provide the herein described ceramic body, such as a process for the production of a ceramic body, comprising a sintering stage comprising sintering a mixture of starting materials, optionally including $SiO_2$, at a temperature in the range of 1500-2000° C. in a first atmosphere to provide a sintered body), followed by an annealing stage comprising an annealing at 1000-1600° C. in a second atmosphere to provide said ceramic body, wherein the first atmosphere differs from the second atmosphere, and wherein the second atmosphere comprises a reducing atmosphere. Hence, the first atmosphere, the atmosphere during at least part of the sintering stage may be reducing (such as including $H_2$) or neutral (such as in an inert gas like $N_2$, or He, etc.). Therefore, in an embodiment the sintering stage is applied in a neutral or oxidizing first atmosphere. As indicated above, especially the starting materials comprise $SiO_2$. It appears that when $SiO_2$ is added as flux material, this may have advantageous effects on the stability of the flux. Further, as known in the art the starting materials may include one or more of carbonate, oxides, etc., of the relevant cations, such as Y, Gd and Al. Further, as indicated above, especially the sintering stage comprises a hot pressing. In this way high quality ceramic bodies may be obtained.

Further, best materials appear to be obtained when the amount of Gd is limited, and/or when also the amount of cerium is relatively low.

In a specific embodiment $0.05 \leq x \leq 0.5$.

In a further embodiment, $0.05 \leq y \leq 0.2$ and $0.0015 \leq z \leq 0.003$. From all ceramic bodies made, ceramic bodies complying with these conditions especially showed the desired optical behaviour. Further, in an embodiment, $0 \leq q < 1$, especially $0 \leq q \leq 0.8$, or $q=0$. Further, in an embodiment $x=0$. When q and x are both substantially zero, good luminescent materials for automotive application may be applied.

The ceramic body, or especially the garnet luminescent material, is configured to convert at least part of the light source light. In other words, one may say that the light source is radiationally coupled to the light converter, especially the luminescent material. The term "radiationally coupled" especially means that the light source and the luminescent material, here the ceramic body, are associated with each other so that at least part of the radiation emitted by the light source is received by the luminescent material (and at least partly converted into luminescence). The ceramic body may be configured at a non-zero distance from the light source, or may be in physical contact. The former embodiment is sometimes also indicated as vicinity or remote, with the former closer and the latter further away from the light source. Herein, in an embodiment the light source comprises a light emitting surface configured at a distance (d) of equal to or less than 1 mm from the ceramic body. Hence, especially the distance is relatively small, or even zero. Hence, in yet a further embodiment the light source comprises a light emitting surface in physical contact with the ceramic body. In these embodiments also the ceramic body will heat up when the light source gets hotter, and also heat generated in the ceramic body by the down conversion process (absorption of short wavelength light from the light source, and emission of longer wavelength light) is conducted through the light source. All temperatures within the physically connected device are determined by the heat conductivity parameters of the physical parts involved. In case of LEDs, one may e.g. also use the socket temperature, as this temperature is proportional to the temperature of the light emitting surface at a given operating current. The invention especially provides its advantages when the ceramic body is coupled to the temperature as the light emitting surface.

In a specific embodiment, the lighting device comprises a plurality of said solid state light sources, wherein the ceramic body is an elongated ceramic body having a first face and a second face defining a length (L) of the elongated ceramic body, the elongated ceramic body comprising one or more radiation input faces and a radiation exit window, wherein the second face comprises said radiation exit window, wherein the plurality of solid state light sources are configured to provide blue light source light to the one or more radiation input faces. In this way, a high brightness source may be generated. In a further embodiment, the lighting device may further comprise an optical reflector configured downstream of the first face and configured to reflect light back into the elongated ceramic body, wherein the radiation exit window is configured perpendicular to the one or more radiation input faces. This may further enhance the outcoupling of the light. In yet another embodiment the elongated ceramic body may comprise a geometrical concentration factor, defined as the ratio of the area of the radiation input faces and the area of the radiation exit window, of at least 2. A factor larger than 1, especially 2 or larger, or even much larger, may provide high brightness sources, which may be applied amongst others also for projector purposes or other purposes. Yet, in another embodiment the lighting device may further comprise a collimator configured downstream of the radiation exit window and configured to collimate the converter light.

As indicated above, one of the applications may be in automotive, such as in head lights of cars, trucks, busses, motors, trains, metros, etc. etc. Hence, in an embodiment the invention also provides an automotive lamp comprising the lighting device as defined herein.

Herein, the term "visible light" especially relates to light having a wavelength selected from the range of 380-780 nm. The transmission can be determined by providing light at a specific wavelength with a first intensity to the ceramic body under perpendicular radiation and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989).

The ceramic body may have any shape, such as beam like or rod like. However, the ceramic body may also be disk like, etc. The invention is not limited to specific embodiments of shapes, neither is the invention limited to embodiments with a single exit window or outcoupling face. Below, some specific embodiments are described in more detail. Would the ceramic body have a circular cross-section, then the width and height may be equal (and may be defined as diameter).

In a specific embodiment, the ceramic body may especially have an aspect ratio larger than 1, i.e. the length is larger than the width. In general, the ceramic body is a rod or bar (beam), though the ceramic body does not necessarily have a square, rectangular or round cross-section. In general, the light source is configured to irradiate one of the longer faces (side edge), herein indicated as radiation input face, and radiation escapes from a face at a front (front edge), herein indicated as radiation exit window. Especially, in embodiments the solid state light source, or other light source, is not in physical contact with the ceramic body. Physical contact may lead to undesired outcoupling and thus a reduction in concentrator efficiency. Further, in general the ceramic body comprises two substantially parallel faces, the radiation input face and opposite thereof the opposite face. These two faces define herein the width of the ceramic body. In general, the length of these faces defines the length of the ceramic body. However, as indicated above, and also below, the ceramic body may have any shape, and may also include combinations of shapes. Especially, the radiation input face has an radiation input face area (A), wherein the radiation exit window has a radiation exit window area (E), and wherein the radiation input face area (A) is at least 1.5 times, even more especially at least two times larger than the radiation exit window area (E), especially at least 5 times larger, such as in the range of 2-50,000, especially 5-5,000 times larger. Hence, especially the elongated ceramic body comprises a geometrical concentration factor, defined as the ratio of the area of the radiation input faces and the area of the radiation exit window, of at least 1.5, such as at least 2, like at least 5, or much larger (see above). This allows e.g. the use of a plurality of solid state light sources (see also below). For typical applications like in automotive or digital projectors, a small but high intense emissive surface is desired. This cannot be obtained with a single LED, but can be obtained with the present lighting device. Especially, the radiation exit window has a radiation exit window area (E) selected from the range of 1-100 mm². With such dimensions, the emissive surface can be small, whereas nevertheless high intensity may be achieved. As indicated above, the ceramic body in general has an aspect ratio (of length/width). This allows a small radiation exit surface, but a large radiation input surface, e.g. irradiated with a plurality of solid state light sources. In a specific embodiment, the ceramic body has a width (W) selected from the range of 0.5-100 mm. The ceramic body is thus especially an integral body, having the herein indicated faces.

The generally rod shaped or bar shaped ceramic body can have any cross sectional shape, but in embodiments has a cross section the shape of a square, rectangle, round, oval, triangle, pentagon, or hexagon. Generally the ceramic bodies are cuboid, but may be provided with a different shape than a cuboid, with the light input surface having somewhat the shape of a trapezoid. By doing so, the light flux may be even enhanced, which may be advantageous for some applications. Hence, in some instances (see also above) the term "width" may also refer to diameter, such as in the case of a ceramic body having a round cross section. Hence, in embodiments the elongated ceramic body further has a width (W) and a height (H), with especially L>W and L>H. Especially, the first face and the second face define the length, i.e. the distance between these faces is the length of the elongated ceramic body. These faces may especially be arranged parallel.

The ceramic body may also be a cylindrically shaped rod. In embodiments the cylindrically shaped rod has one flattened surface along the longitudinal direction of the rod and at which the light sources may be positioned for efficient incoupling of light emitted by the light sources into the ceramic body. The flattened surface may also be used for placing heat sinks The cylindrical ceramic body may also have two flattened surfaces, for example located opposite to each other or positioned perpendicular to each other. In embodiments the flattened surface extends along a part of the longitudinal direction of the cylindrical rod.

The ceramic body as set forth below in embodiments according to the invention may also be folded, bended and/or shaped in the length direction such that the ceramic body is not a straight, linear bar or rod, but may comprise, for example, a rounded corner in the form of a 90 or 180 degrees bend, a U-shape, a circular or elliptical shape, a loop or a 3-dimensional spiral shape having multiple loops. This provides for a compact ceramic body of which the total length, along which generally the light is guided, is relatively large, leading to a relatively high lumen output, but can at the same time be arranged into a relatively small space. For example luminescent parts of the ceramic body may be rigid while transparent parts of the ceramic body are flexible to provide for the shaping of the ceramic body along its length direction. The light sources may be placed anywhere along the length of the folded, bended and/or shaped ceramic body.

Parts of the ceramic body that are not used as light incoupling area or light exit window may be provided with a reflector. Hence, in an embodiment the lighting device further comprises a reflector configured to reflect luminescent material light back into the ceramic body. Therefore, the lighting device may further include one or more reflectors, especially configured to reflect radiation back into the ceramic body that escapes from one or more other faces than the radiation exit window. Especially, a face opposite of the radiation exit window may include such reflector, though in an embodiment not in physical contact therewith. Hence, the reflectors may especially not be in physical contact with the ceramic body. Therefore, in an embodiment the lighting device further comprises an optical reflector (at least) configured downstream of the first face and configured to reflect light back into the elongated ceramic body. Alternatively or additionally, optical reflectors may also be arranged at other faces and/or parts of faces that are not used to couple light source light in or luminescence light out. Especially, such optical reflectors may not be in physical contact with the ceramic body. Further, such optical reflector(s) may be configured to reflect one or more of the luminescence and light source light back into the ceramic body. Hence, substantially all light source light may be reserved for conversion by the luminescent material (i.e. the activator element(s) such as especially $Ce^3$) and a substantial part of the luminescence may be reserved for outcoupling from the radiation exit window. The term "reflector" may also refer to a plurality of reflectors.

Especially for automotive applications, the light source may comprises a light emitting surface comprising a light emitting surface area (AL), wherein the ceramic body comprises a radiation input surface comprising a ceramic body surface area (A) and a radiation exit window comprising a radiation exit window area (E), wherein $0.8 \leq A/AL \leq 1.2$ and wherein $0.8 \leq E/AL \leq 1.5$, especially $1 \leq E/AL \leq 1.5$.

The terms "coupling in" and similar terms and "coupling out" and similar terms indicate that light changes from medium (external from the ceramic body into the ceramic body, and vice versa, respectively). In general, the light exit window will be a face (or a part of a face), configured (substantially) perpendicular to one or more other faces of the waveguide. In general, the ceramic body will include one or more body axes (such as a length axis, a width axis or a height axis), with the exit window being configured (substantially) perpendicular to such axis. Hence, in general, the light input face(s) will be configured (substantially) perpendicular to the light exit window. Thus, the radiation exit window is especially configured perpendicular to the one or more radiation input faces. Therefore, especially the face comprising the light exit window does not comprise a light input face.

Downstream of the radiation exit window, optionally an optical filter may be configured.

In yet a further embodiment, the lighting device further comprises a collimator configured downstream of the radiation exit window and configured to collimate the converter light. Such collimator, like e.g. a CPC (compound parabolic concentrator), may be used to collimate the light escaping from the radiation exit window and to provide a collimated beam of light.

Further, the lighting device may include a heat sink configured to facilitate cooling of the solid state light source and/or luminescent concentrator. The heat sink may comprise or consist of copper, aluminum, silver, gold, aluminum carbide, aluminum nitride, boron nitride, aluminum silicon carbide, beryllium oxide, silicon-silicon carbide, aluminum silicon carbide, copper tungsten alloys, copper molybdenum carbides, carbon, diamond, graphite, and combinations of two or more thereof. The lighting device may further include one or more cooling elements configured to cool the ceramic body.

Especially, the light sources are light sources that during operation emit (light source light) at least light at a wavelength selected from the range of 200-490 nm, especially light sources that during operation emit at least light at wavelength selected from the range of 400-490 nm, even more especially in the range of 440-490 nm. This light may partially be used by the luminescent material. Hence, in a specific embodiment, the light source is configured to generate blue light. In a specific embodiment, the blue light source light has a dominant wavelength selected from the range of 430-450 nm.

In a specific embodiment, the light source comprises a solid state LED light source (such as a LED or laser diode). The term "light source" may also relate to a plurality of light sources, such as e.g. 2-20 (solid state) LED light sources, though many more light sources may be applied. Hence, the term LED may also refer to a plurality of LEDs. Hence, as indicated herein, the term "solid state light source" may also refer to a plurality of solid state light sources. In an embodiment (see also below), these are substantially identical solid state light sources, i.e. providing substantially identical spectral distributions of the solid state light source radiation. In embodiments, the solid state light sources may be configured to irradiate different faces of the ceramic body.

The lighting device comprises a plurality of light sources. Especially, the light source light of the plurality (m) of light sources have spectral overlap, even more especially, they are of the same type and provide substantial identical light (having thus substantial the same spectral distribution). Hence, the light sources may substantially have the same emission maximum, such as within a bandwidth of 10 nm.

The light sources are especially configured to provide a blue optical power ($W_{opt}$) of at least 0.2 Watt/mm² to the ceramic body, i.e. to the radiation input face(s). The blue optical power is defined as the energy that is within the energy range that is defined as blue part of the spectrum (see also below). Especially, the photon flux is in average at least 4.5*10$^{17}$ photons/(s.mm²), such as at least 6.0*10$^{17}$ photons/(s.mm²). Further, in a specific embodiment the length (L) is at least 20 mm. In yet a further specific embodiment, the cerium concentration is in the range of 0.1-3.0% of A.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting, etc.

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

In an embodiment, the light source may also provide light source light having a correlated color temperature (CCT) between about 5000 and 20000 K, e.g. direct phosphor converted LEDs (blue light emitting diode with thin layer of phosphor for e.g. obtaining of 10000 K). Hence, in a specific embodiment the light source is configured to provide light source light with a correlated color temperature in the range of 5000-20000 K, even more especially in the range of 6000-20000 K, such as 8000-20000 K. An advantage of the relative high color temperature may be that there may be a relative high blue component in the light source light.

The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 560-570 nm. The terms "orange light" or "orange emission" especially relate to light having a wavelength in the range of about 570-600. The terms "red light" or "red emission" especially relate to light having a wavelength in the range of about 600-780 nm. The term "pink light" or "pink emission" refers to light having a blue and a red component. The terms "visible", "visible light" or "visible emission" refer to light having a wavelength in the range of about 380-780 nm.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily on scale.

DETAILED DESCRIPTION OF THE EMBODIMENTS

For some white LED applications, e.g. automotive forward lighting, a stable flux output at different temperatures is required. Blue InGaN LEDs reduce output power with increasing temperature. This invention describes the combination of a blue LED with a yellow emitting phosphor with stable white flux output with varying LED and phosphor temperature, by using a Lumiramic converter which increases QE as a function of temperature (at high blue power input).

Figure 1:
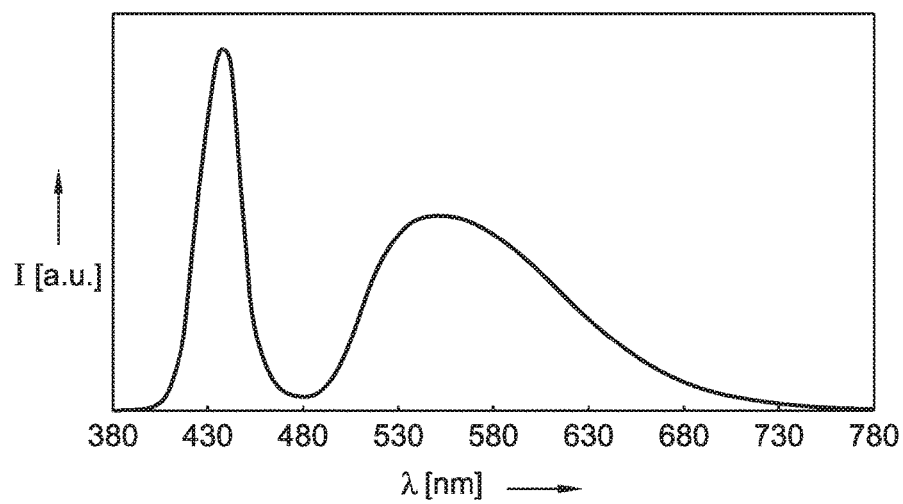
FIG. 1 shows the emission spectrum of a phosphor converted blue LED. Color point is: u'=0.204, v'=0.478 (CIE 1976). The blue peak wavelength is 439 nm.

In automotive forward lighting white LEDs are used, made of a blue emitting InGaN LED (430-460 nm peak emission) combined with a yellow emitting garnet phosphor $(Y,Gd)_3Al_5O_{12}$ activated with Ce. FIG. 1 shows a typical white emission spectrum. Here the garnet phosphor consists of a Lumiramic converter with a Ce conc. of 0.24% and a Gd concentration of 13% (i.e. $(Y_{0.8676}Gd_{0.13}Ce_{0.0024})_3Al_5O_{12}$. FIG. 1 shows the emission spectrum of a phosphor converted blue LED. Color point is: u'=0.204, v'=0.478 (CIE 1976). The blue peak wavelength is 439 nm.

Although Blue emitting AlInGaN LEDs have an excellent external efficiency as a function of temperature, blue power at constant current decreases with increasing temperatures for current LED devices. For white LEDs the decrease in output power translates into a decrease of emitted white flux. For application of YAG phosphors, depending on phosphor composition the effect is amplified by so-called thermal quenching of the phosphor, describing the decrease of quantum efficiency with increasing temperature.

Amongst others, the current invention provides a white phosphor converted LED with a color point especially of 0.2<u'<0.21 and 0.45<v'<0.5 (with the CIE1976 color coordinates u' and v'). This may be achieved by combining a blue InGaN LEDs with a garnet phosphor of the composition of $(Y_{(1-y-q-z)},Gd_y,Lu_q,Ce_z)_3(Al_{(1-x)},Ga_x)_5O_{12}$, with $0 \leq x \leq 0.6$, $0 \leq y \leq 0.5$, $0 \leq q \leq 1$, and $0.001 \leq z \leq 0.06$, even more especially in an embodiment x>0, such as 0<x≤0.5, and within yet a further embodiment $0.05 \leq y \leq 0.2$, and $0.0015 \leq z \leq 0.03$. In order to achieve the desired functionality the material is sintered in oxygen for 8 hours at 1750° C. and after cooling down at room temperature the material is anneal in reducing atmosphere, e.g. forming gas ($N_2/H_2$) at 1100° C.<1450° C. for a longer period in time, depending on temperature. As a result of this preparation process with a material of the above composition a material is formed that contains a large number of oxygen vacancies. If such a material is illuminated at ambient temperature with uv-light (λ<370 nm), surprisingly a bright thermo luminescence will be observed when the phosphor temperature is raised above room temperature.

Ceramics have been prepared by reactive sintering of a mixture of yttrium oxide ($Y_2O_3$), gadolinium oxide ($Gd_2O_3$), cerium oxide ($CeO_2$) and aluminum oxide ($Al_2O_3$) and a $SiO_2$ containing fluxing agent. Green body preparation can be by uniaxial pressing, slip casting, injection molding, extrusion, tape-casting or other ceramic green body forming techniques. Green bodies were sintered in air or oxygen at temperatures between 1400° C. and 1700° C. dependent on the basic composition (Gd concentration, Al excess or "shortage") and the concentration of $SiO_2$-containing sinter aid. Samples were annealed in reductive atmosphere ($H_2$, $N_2/H_2$ of various $H_2$ concentrations) to create lattice defects.

Figure 2:
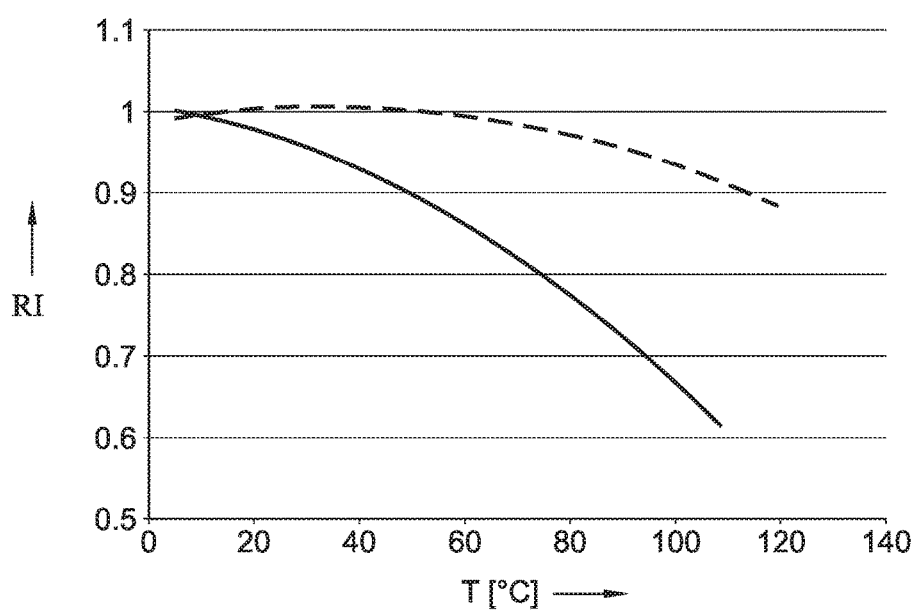
FIG. 2 shows a normalized emitted flux (relative intensity (RI)) of a typical white LED as a function of socket temperature operated at 1 A, constructed of a blue LED in combination with a yellow emitting YAG phosphor. The solid line displays the temperature dependence of the flux of a state of the art white LED; the dashed line displays the temperature dependence of the flux of lighting device according to current invention.

FIG. 2 shows a normalized emitted flux of a typical white LED as a function of socket temperature operated at 1A, constructed of a blue LED in combination with a yellow emitting YAG phosphor in form of a ceramic body. The solid line displays the temperature dependence of the flux of a state of the art white LED; the dashed line displays the temperature dependence of the flux of lighting device according to current invention. The measurements were done with a short pulse of operation (20 ms) for each temperature. It is clear that the device according to the invention has superior thermal stability.

Figure 3A:
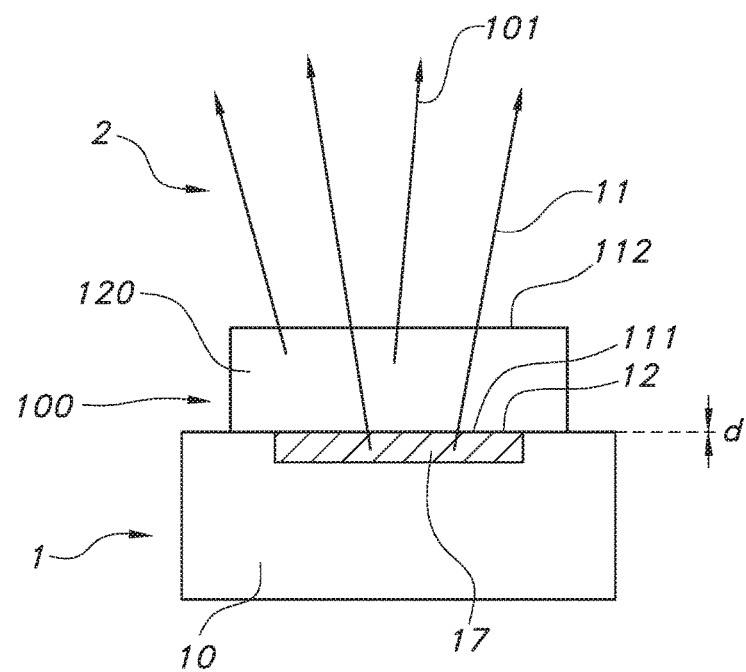
FIGS. 3a-3c schematically show embodiments of phosphor converted white LED devices (pcLEDs) and an automotive lamp, respectively.
Figure 3B:
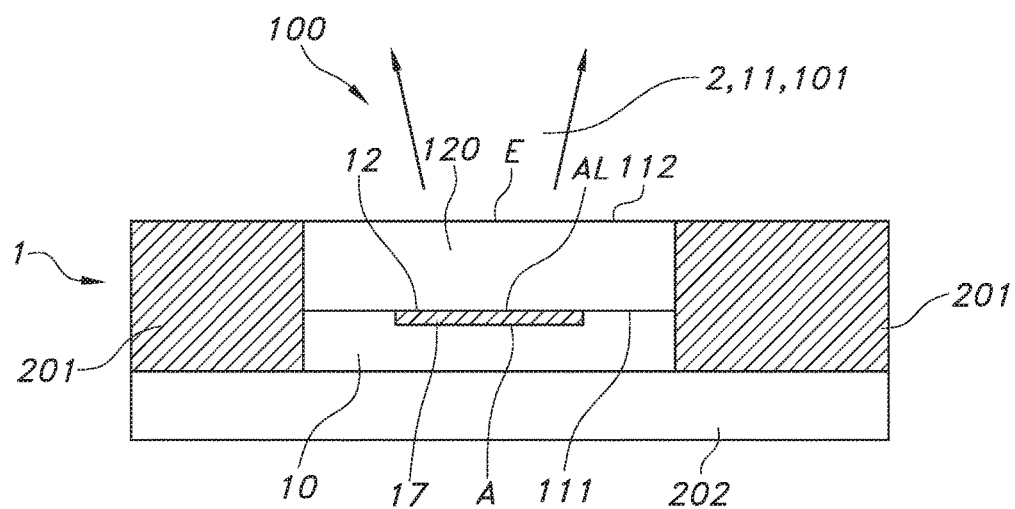
Figure 3C:
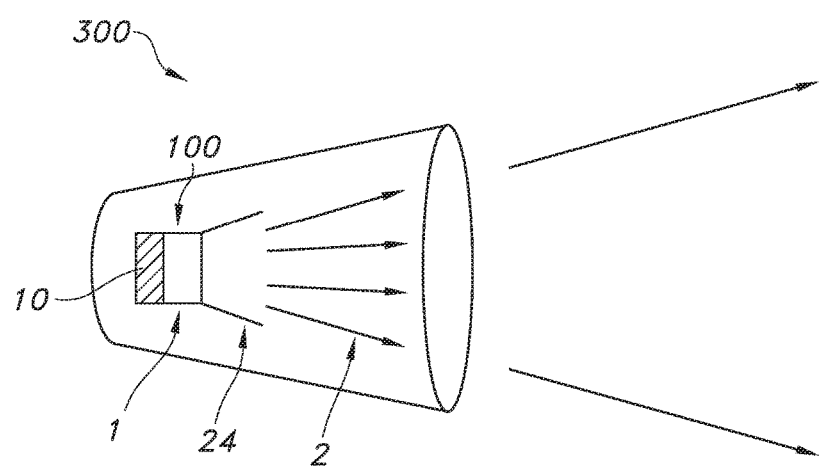

FIGS. 3a-3c schematically show embodiments of phosphor converted white LED devices pcLEDs and an automotive lamp, respectively.

FIG. 3a schematically depicts an embodiment of a lighting device 1 comprising a solid state light source 10 and a ceramic body 100, wherein the solid state light source 10 is configured to provide blue light source light 11 to the ceramic body 100. The ceramic body 100 comprises a ceramic material 120 configured to wavelength convert part of the blue light source light 11 into yellow converter light 101, to provide white lighting device light 2 comprising said blue light source light 11 and said yellow converter light 101. Especially, said white lighting device light 2 has a color point selected from the range $0.18 \leq u' \leq 0.25$ and $0.42 \leq v' \leq 0.54$. Further, the ceramic material 120 comprises a $(Y_{(1-y-q-z)},Gd_y,Lu_q,Ce_z)_3(Al_{(1-x)},Ga_x)_5O_{12}$ ceramic material, with $0 \leq x \leq 0.6$, $0 \leq y \leq 0.5$, $0 \leq q < 1$, and $0.001 \leq z \leq 0.06$. Especially, in an embodiment x>0, such as 0<x≤0.5, like x is at least 0.05. In yet a further embodiment $0.05 \leq y \leq 0.2$, and $0.0015 \leq z \leq 0.03$. The light source comprises a light emitting surface 12, here a LED die, having a surface area AL configured at a distance d of equal to or less than 1 mm from the ceramic body 100. In the herein schematically depicted embodiments, the light source 10 comprises said light emitting surface 12 being in physical contact with the ceramic body 100, i.e. d=0 mm. Reference 111 indicates a radiation input face. Further the ceramic body 100 comprises a radiation exit window 112, downstream of the former. The radiation input surface 111 has a surface area A and the radiation exit window 112 has a surface area E. especially for automotive applications wherein $0.8 \leq A/AL \leq 1.2$ and wherein $1 \leq E/AL \leq 1.5$.

Hence, the ceramic body 100, described herein, is especially applied in a transmissive configuration.

FIG. 3b schematically depicts an embodiment of a typical configuration of a phosphor converted LED as used for applications for imaging systems, or other applications. A blue emitting die is covered with a yellow emitting phosphor. In order to keep the luminescent area small, the phosphor layer has a size fitting the blue LED area closely, and the sides of LED and phosphor, which is a Lumiramic converter in this case, are covered with a white side coat (reflector 201), which usually consists of a white powder suspended in silicone, effectively reflecting blue and yellow light. Reference 202 indicates a package or PCB.

FIG. 3c schematically depicts an automotive lamp 300, such as a headlight, comprising the lighting device 1 as described herein, with downstream thereof a collimator 24. A light emitting device according to the invention may be used in applications including but not being limited to a lamp, a light module, a luminaire, a spot light, a flash light, a projector, a (digital) projection device, automotive lighting such as e.g. a headlight or a taillight of a motor vehicle, arena lighting, theater lighting and architectural lighting.

Light sources which are part of the embodiments according to the invention as set forth below, may be adapted for, in operation, emitting light with a first spectral distribution. This light is subsequently coupled into a light guide or waveguide; here the ceramic body. The light guide or waveguide may convert the light of the first spectral distribution to another spectral distribution and guides the light to an exit surface.

Figure 4A:
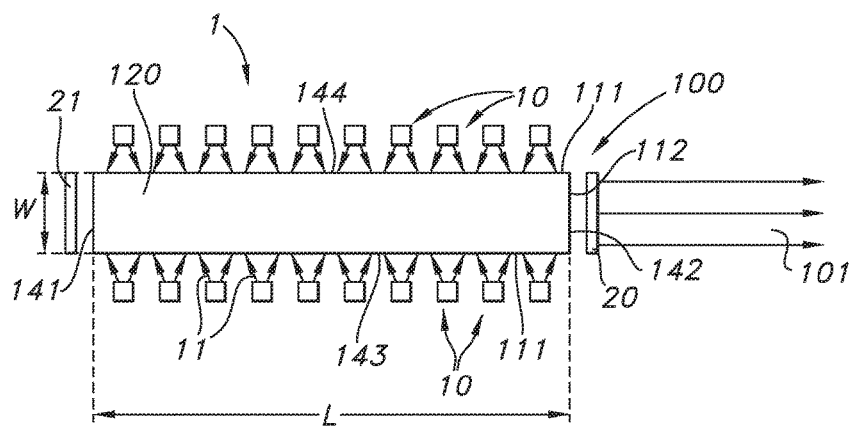
FIGS. 4a-4c schematically depict some further aspects of the invention.

An embodiment of the lighting device as defined herein is schematically depicted in FIG. 4a. FIG. 4a schematically depicts a lighting device 1 comprising a plurality of solid state light sources 10 and an elongated ceramic body 100 having a first face 141 and a second face 142 defining a length L of the elongated ceramic body 100. The elongated ceramic body 100 comprises one or more radiation input faces 111, here by way of example two oppositely arranged faces, indicated with references 143 and 144 (which define e.g. the width W). Further the ceramic body 100 comprises a radiation exit window 112, wherein the second face 142 comprises said radiation exit window 112. The entire second face 142 may be used or configured as radiation exit window. The plurality of solid state light sources 10 are configured to provide (blue) light source light 11 to the one or more radiation input faces 111. As indicated above, they especially are configured to provide to at least one of the radiation input faces 111 a blue power $W_{opt}$ of in average especially, but not exclusively, at least 0.067 Watt/mm$^2$.

The elongated ceramic body 100 comprises a ceramic material 120 configured to wavelength convert at least part of the (blue) light source light 11 into converter light 101, such as at least one or more of green and red converter light 101. As indicated above the ceramic material 120 comprises an $A_3B_5O_{12}LCe^{3+}$ ceramic material, wherein A comprises e.g. one or more of yttrium (Y), gadolinium (Gd) and lutetium (Lu), and wherein B comprises e.g. aluminum (Al), (however) especially as defined above. References 20 and 21 indicate an optical filter and a reflector, respectively. The former may reduce e.g. non-green light when green light is desired or may reduce non-red light when red light is desired. The latter may be used to reflect light back into the ceramic body or waveguide, thereby improving the efficiency. Note that more reflectors than the schematically depicted reflector may be used.

The light sources may in principle be any type of point light source, but is in an embodiment a solid state light source such as a Light Emitting Diode (LED), a Laser Diode or Organic Light Emitting Diode (OLED), a plurality of LEDs or Laser Diodes or OLEDs or an array of LEDs or Laser Diodes or OLEDs, or a combination of any of these. The LED may in principle be an LED of any color, or a combination of these, but is in an embodiment a blue light source producing light source light in the UV and/or blue color-range which is defined as a wavelength range of between 380 nm and 490 nm. In another embodiment, the light source is an UV or violet light source, i.e. emitting in a wavelength range of below 420 nm. In case of a plurality or an array of LEDs or Laser Diodes or OLEDs, the LEDs or Laser Diodes or OLEDs may in principle be LEDs or Laser Diodes or OLEDs of two or more different colors, such as, but not limited to, UV, blue, green, yellow or red.

Figure 4B:
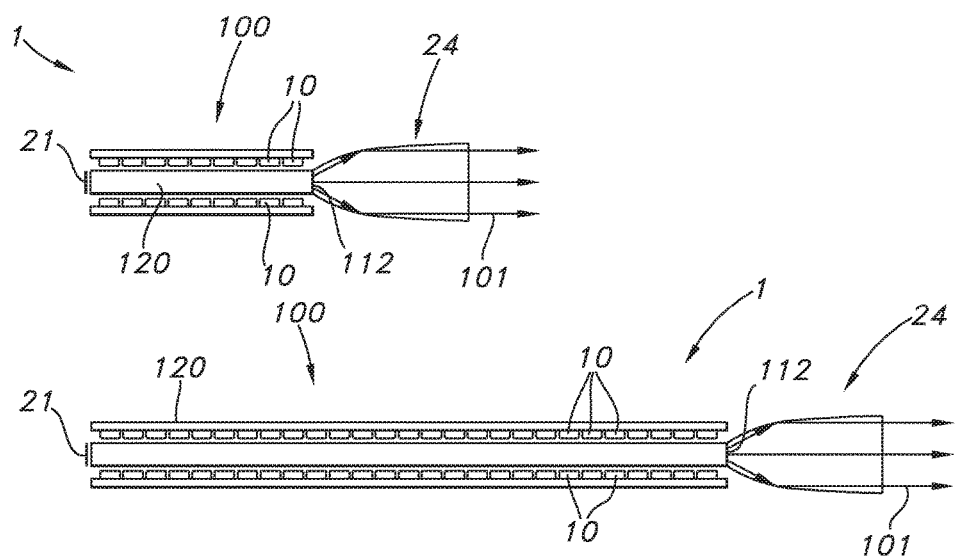

FIGS. 4a-4b schematically depict similar embodiments of the lighting device. Further, the lighting device may include further optical elements, either separate from the waveguide and/or integrated in the waveguide, like e.g. a light concentrating element, such as a compound parabolic light concentrating element (CPC). The lighting devices 1 in FIG. 4b further comprises a collimator 24, such as a CPC.

Figure 4C:
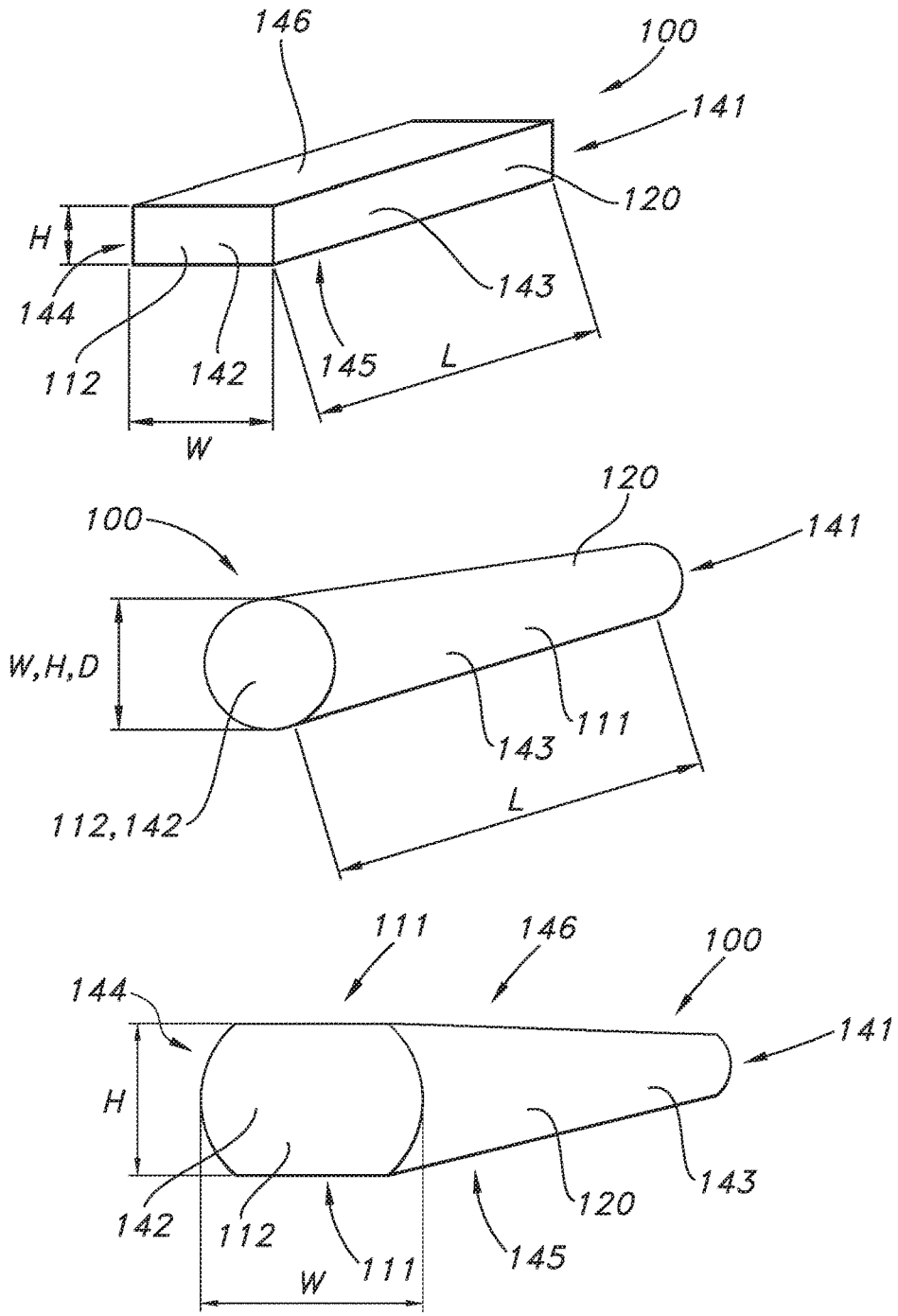

FIG. 4c schematically depicts some embodiments of possible ceramic bodies as waveguides or luminescent concentrators. The faces are indicated with references 141-146. The first variant, a plate-like or beam-like ceramic body has the faces 141-146. Light sources, which are not shown, may be arranged at one or more of the faces 143-146. The second variant is a tubular rod, with first and second faces 141 and 142, and a circumferential face 143. Light sources, not shown, may be arranged at one or more positions around the ceramic body. Such ceramic body will have a (substantially) circular or round cross-section. The third variant is substantially a combination of the two former variants, with two curved and two flat side faces. The variants shown in FIG. 4c are not limitative. More shapes are possible; i.e. for instance referred to WO2006/054203, which is incorporated herein by reference. The ceramic bodies, which are used as light guides, generally may be rod shaped or bar shaped light guides comprising a height H, a width W, and a length L extending in mutually perpendicular directions and are in embodiments transparent, or transparent and luminescent. The light is guided generally in the length L direction. The height H is in embodiments <10 mm, in other embodiments <5mm, in yet other embodiments <2 mm. The width W is in embodiments <10 mm, in other embodiments <5 mm, in yet embodiments <2 mm. The length L is in embodiments larger than the width W and the height H, in other embodiments at least 2 times the width W or 2 times the height H, in yet other embodiments at least 3 times the width W or 3 times the height H. Hence, the aspect ratio (of length/width) is especially larger than 1, such as equal to or larger than 2. Unless indicated otherwise, the term "aspect ratio" refers to the ratio length/width.

The aspect ratio of the height H:width W is typically 1:1 (for e.g. general light source applications) or 1:2, 1:3 or 1:4 (for e.g. special light source applications such as headlamps) or 4:3, 16:10, 16:9 or 256:135 (for e.g. display applications). The light guides generally comprise a light input surface and a light exit surface which are not arranged in parallel planes, and in embodiments the light input surface is perpendicular to the light exit surface. In order to achieve a high brightness, concentrated, light output, the area of light exit surface may be smaller than the area of the light input surface. The light exit surface can have any shape, but is in an embodiment shaped as a square, rectangle, round, oval, triangle, pentagon, or hexagon.

Figure 5:
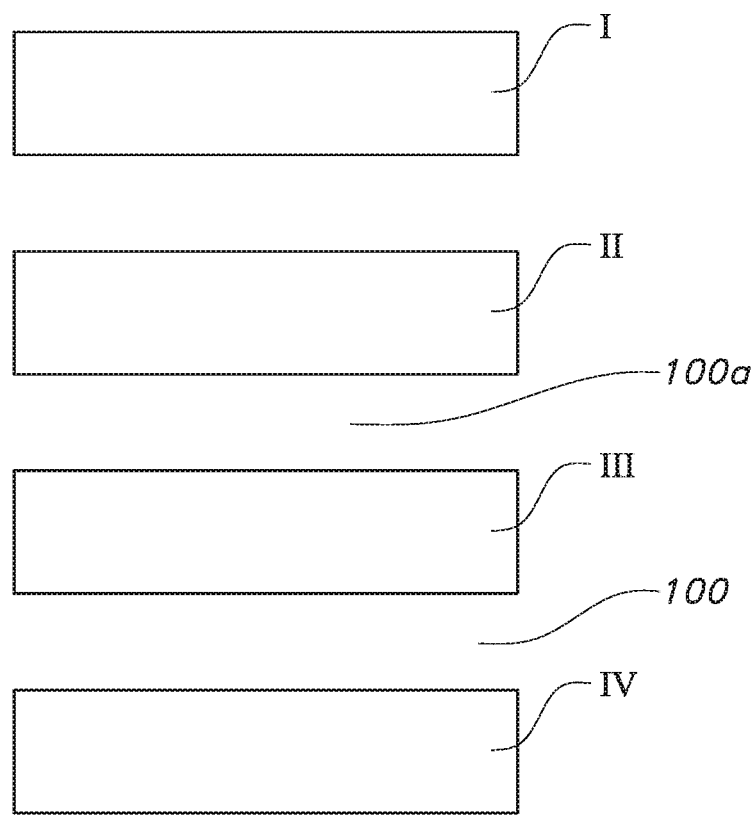
FIG. 5 schematically depicts some aspects of an embodiment of the processing of the ceramic body and optional further stages.

FIG. 5 schematically depicts some aspects of an embodiment of the processing of the ceramic body and optional further stages. Stage I indicates providing a combination of starting materials and green body formation. Stage II indicates a sintering stage. Stage III indicates an annealing stage, and stage IV indicates a subsequent processing stage, like polishing, grinding, dicing and building a device. Note that optionally between the indicated stages, other actions or stages may be included, such as a cooling stage between the sintering stage and the annealing stage, etc. etc.

Figure 6A:
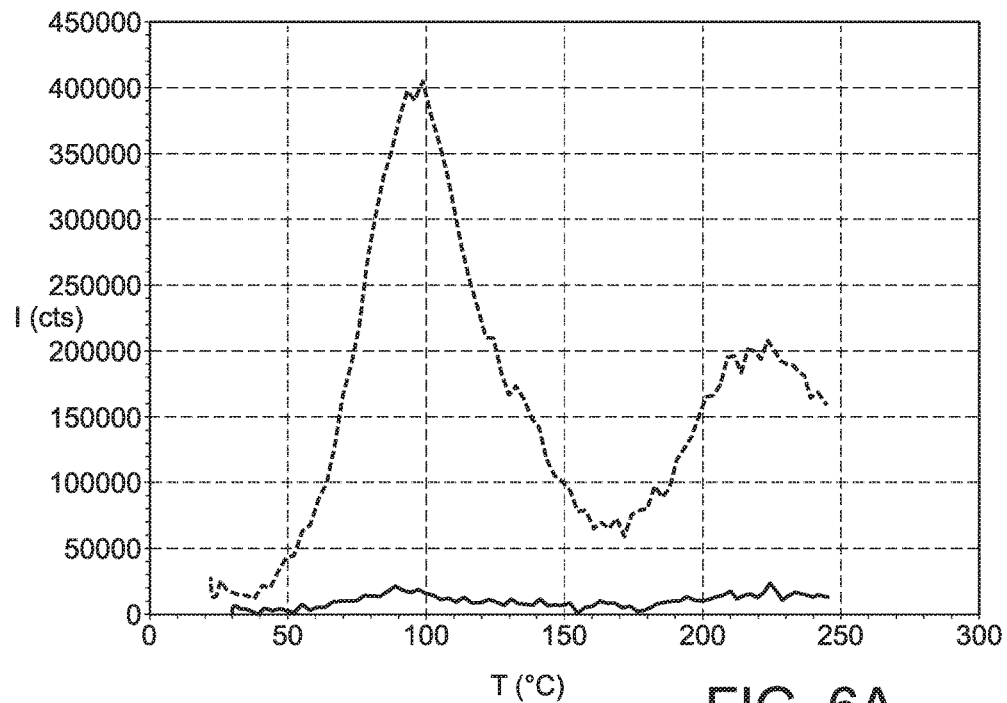
FIGS. 6a-6b show some thermo luminescence data.
Figure 6B:
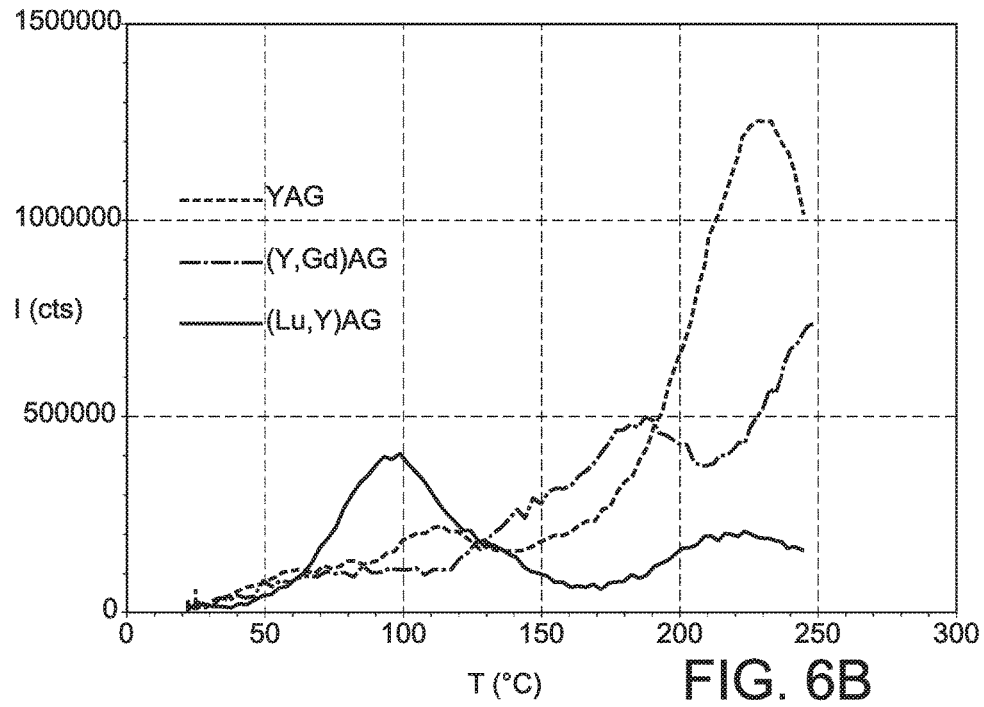

FIG. 6a show the glow curves of the standard as-sintered Y,GdAG material (see also below)_before (lower curve) and after annealing (higher curve) in forming gas. The glow curves are generated by illuminating the material with exciting light (here 360 nm wavelength). After the illumination phase the lamp is switched off and the emitted light is detected while the sample temperature is continuously increased with a linear temperature ramp. Here the temperature increase rate was ~84 K/min. While the "as-sintered" glow curve hardly shows any thermo luminescence, the annealed sample exhibits high intensity TL, with two peaks located at different temperatures, indicating the existence of at least two different trap states in the material. FIG. 6b shows a comparison of glow curves of different garnet materials after annealing. The stoichiometry of the samples is given below:

|  | Gd (%, not including Ce) | Lu (%, not including Ce) | Ce (%) | $SiO_2$ (ppm) |
|---|---|---|---|---|
| (Y, Gd)AG | 12.6 | 0 | 0.22 | 1000 |
| YAG | 0 | 0 | 0.25 | 1500 |
| (Lu, Y)AG | 0 | 50 | 0.25 | 2000 |

The integrated thermo luminescence light, which may be directly proportional to the defect density in the material, was measured between 25-240° C. at a given heating rate and a given UV exposure, with identical settings before and after annealing. It was found that the ratio of thermo luminescence after anneal to thermo luminescence before anneal is in the range of >10, such as at least 12.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

The invention claimed is:

1. A process including the production of a ceramic body, wherein the ceramic body comprises a $(Y_{1-y-q-z},Gd_y,Lu_q,Ce_z)_3(Al_{1-x},Ga_x)_5O_{12}$ ceramic material, with $0 \leq x \leq 0.6$, $0 \leq y \leq 0.5$, $0 \leq q < 1$, and $0.001 \leq z \leq 0.06$, the process comprising:
   a sintering stage comprising sintering a mixture of starting materials at a temperature in the range of 1500-2000° C. in a first atmosphere to provide a sintered body; and
   an annealing stage, following the sintering stage, comprising an annealing at 1000-1600° C. in a second atmosphere to provide said ceramic body, the first atmosphere differing from the second atmosphere,
   the first atmosphere comprising a neutral or oxidizing atmosphere and the second atmosphere comprising a reducing atmosphere.

2. The process according to claim 1, wherein the starting materials comprise $SiO_2$, and wherein the sintering stage comprises a hot pressing.

3. The process according to claim 1, wherein the starting materials comprise $SiO_2$.

4. The process according to claim 1, wherein the ceramic body is configured to wavelength convert part of a blue light source light into yellow converter light, to provide a white lighting device light comprising said blue light source light and said yellow converter light, said white lighting device light having a color point selected from the range of $0.18 \leq u' \leq 0.25$ and $0.42 \leq v' \leq 0.54$, and the ceramic material comprising a $(Y_{1-y-q-z},Gd_y,Lu_q,Ce_z)_3(Al_{1-x},Ga_x)_5O_{12}$ ceramic material, with $0 \leq x \leq 0.6$, $0 \leq y \leq 0.5$, $0 \leq q < 1$, and $0.001 \leq z \leq 0.06$.

5. The process according to claim 4 further comprising optically coupling the ceramic material to a solid state blue light source.

6. The process according to claim 5, wherein $0.0 \leq x \leq 0.5$, $0.05 \leq y \leq 0.2$, and $0.0015 \leq z \leq 0.03$, and the blue light source light has a dominant wavelength selected from the range of 430-450 nm.

7. The process according to claim 5, wherein the blue light source comprises a light emitting surface configured at a distance of equal to or less than 1 mm from the ceramic body.

8. The process according to claim 7, wherein the blue light source comprises a light emitting surface in physical contact with the ceramic body.

9. The process according to claim 7, wherein the blue light source comprises a plurality of blue light solid state emitting devices, wherein the ceramic body is an elongated ceramic body having a first face and a second face defining a length of the elongated ceramic body, the elongated ceramic body comprising one or more radiation input faces and a radiation exit window, the second face comprising said radiation exit window, the plurality of solid state emitting devices being configured to provide blue light source light to the one or more radiation input faces.

10. The process according to claim 9, further comprising:
providing an optical reflector configured downstream of the first face and configured to reflect light back into the elongated ceramic body, wherein the radiation exit window is configured perpendicular to the one or more radiation input faces.

11. The process according to claim 9, wherein the elongated ceramic body comprises a geometrical concentration factor, defined as the ratio of the area of the radiation input faces and the area of the radiation exit window, of at least 2, the process further comprising:
providing a collimator configured downstream of the radiation exit window and configured to collimate the converter light.

* * * * *